United States Patent [19]
Hosono et al.

[11] Patent Number: 5,486,449
[45] Date of Patent: Jan. 23, 1996

[54] PHOTOMASK, PHOTORESIST AND PHOTOLITHOGRAPHY FOR A MONOLITHIC IC

[75] Inventors: Hitoshi Hosono; Satoru Takasugi, both of Kyoto, Japan

[73] Assignee: ROHM Co., Ltd., Kyoto, Japan

[21] Appl. No.: 935,345

[22] Filed: Aug. 28, 1992

Related U.S. Application Data

[63] Continuation of Ser. No. 476,534, Feb. 7, 1990, abandoned.

[30] Foreign Application Priority Data

| Feb. 7, 1989 | [JP] | Japan | 1-28496 |
| Feb. 7, 1989 | [JP] | Japan | 1-28497 |
| Feb. 14, 1989 | [JP] | Japan | 1-34338 |
| Feb. 14, 1989 | [JP] | Japan | 1-34339 |
| Feb. 20, 1989 | [JP] | Japan | 1-41069 |
| Feb. 20, 1989 | [JP] | Japan | 1-41070 |
| Feb. 23, 1989 | [JP] | Japan | 1-44713 |
| Feb. 23, 1989 | [JP] | Japan | 1-44714 |
| Feb. 23, 1989 | [JP] | Japan | 1-44715 |
| Mar. 3, 1989 | [JP] | Japan | 1-52482 |

[51] Int. Cl.[6] .................................................. G03F 5/24
[52] U.S. Cl. .................... 430/328; 430/313; 430/322; 430/324; 430/330; 430/396
[58] Field of Search .................................. 430/312, 322, 430/325, 327, 328, 396, 330, 313, 324, 311, 319

[56] References Cited

U.S. PATENT DOCUMENTS

| 4,533,624 | 8/1985 | Sheppard . | |
| 4,536,421 | 8/1985 | Matsuzawa et al. | 430/324 |
| 4,600,667 | 6/1986 | Uchida . | |
| 4,645,562 | 2/1987 | Liao et al. . | |
| 4,649,101 | 3/1987 | Thiel et al. | 430/324 |
| 4,704,347 | 11/1987 | Vollenbroek et al. | 430/312 |
| 4,895,779 | 1/1990 | Yoshioka et al. | 430/324 |
| 4,937,176 | 6/1990 | Vollenbroek et al. . | |
| 4,975,382 | 12/1990 | Takasugi | 437/40 |
| 5,162,194 | 11/1992 | Morgan | 430/311 |

OTHER PUBLICATIONS

Michael Bolsen, "AZ® 5200 Resists for Positive- and Negative Patterning", *Hoechst High Chem*, Jul. 1988.

*Primary Examiner*—Thorl Chea
*Attorney, Agent, or Firm*—Burns, Doane, Swecker & Mathis

[57] ABSTRACT

A method for making a three dimensional structure of the aperture in a photoresist layer on a semiconductor substrate by differentiating dose of exposure light between parts of a photoresist layer. One example of the three dimensional structure is an overhang-platform structure; that is, one side wall of a narrow aperture has an overhang and the opposite side wall has a platform. By separately forming one photoresist layer segment having the overhang wall and the other photoresist layer segment having the platform wall, the distance between the edges of the overhang and the platform can be made smaller than the resolution limit of the photoresist material, which enables making a path line on a substrate whose width is smaller than the resolution limit. Many types of photoresist layers and photomasks for producing such photoresist layers are disclosed.

5 Claims, 16 Drawing Sheets

PHOTOMASK, PHOTORESIST AND PHOTOLITHOGRAPHY FOR A MONOLITHIC IC

This application is a continuation of application Ser. No. 07/476,534, filed Feb. 7, 1990, now abandoned.

The present invention relates to a new method of photolithography for a monolithic IC that can make very narrow patterns on a substrate. The disclosure also includes new structures of photomasks and photoresists appropriate to the photolithography.

BACKGROUND

Conventionally, a pattern of metal deposit or impurity doping on a substrate is formed as follows:

a. coat the substrate with a photoresist layer;

b. prepare a photomask (or a reticle) made of a transparent plate (such as of glass or quartz crystal) with an opaque pattern described on it;

c. cast light through the photomask on the photoresist layer;

d. process the photoresist layer with a proper solvent, whereby only the exposed part (or the unexposed part) of the layer is washed out to reveal an aperture in the photoresist layer having the same pattern on the substrate;

e. metal is deposited or impurity dopant is cast on the patterned photoresist-substrate; and f. take away the remaining photoresist layer to obtain the desired pattern of metal deposit or impurity doping.

In order to increase the density of an IC chip the number of parts included in one chip) and to improve basic characteristics of an IC chip as a microwave device, every size of the pattern elements (typically, width of a line) should be minimized. But the width of a line is limited by the resolution limit of the photoresist material: for example, when ultraviolet light having wavelength of 365 nm (i-line UV) is used, the photoresist pattern obtained in step d cannot have a line narrower than the resolution limit of the photoresist material (about 0.4 µm).

The photolithographic method of the present invention is based on the 'image reversal process', which is detailed in "AZ (trade name) 5200 Resists for Positive- and Negative Patterning" by Michael Bolsen, Hoechst Japan Limited, Electronic Materials Division (Japanese parallel is disclosed in pp. 43–48 of June, 1989 issue of a Japanese magazine "Electronic Material").

SUMMARY OF THE INVENTION

An object of the present invention is to provide a photolithographic method that can draw a line having width smaller than the wavelength of the exposure light.

Another object is to provide a photoresist layer having a three-dimensional structure appropriate to produce such a fine line of a pattern.

Further object of the present invention is to provide a simple method to make such a special photoresist layer.

And still further object of the present invention is to provide some applications using the special structure of the photoresist layer.

Those and other objects are achieved by the photolithographic method of the present invention for forming a photoresist layer with an aperture. The inventive method comprises the steps of:

(a) shielding a first part of the photoresist layer from light;

(b) exposing a second part of the photoresist layer to light; and (c) exposing the other part of the photoresist layer to light whose dose is less than the dose of light on the second part in the step (b).

Another feature of the present invention is a photolithographic method for forming a photoresist layer with an aperture on a substrate for photolithography, where a side wall of the aperture has surface curving along the depth of the photoresist layer. The method comprises the steps of:

(a) coating the substrate with a photoresist layer;

(b) pre-baking the photoresist layer;

(c) casting light through a photomask having a transparency gradation between a masked area and an unmasked area onto the photoresist layer to stabilize a part of the photoresist layer that has absorbed the light; and (d) resolving the part of the photoresist layer that has not stabilized in step (c) by using a proper solvent.

Details of the method, the structure of the photoresist layer, the photomasks appropriate to the method and some applications of such photoresist layers are described in the description of the preferred embodiments that follows.

BRIEF DESCRIPTION OF THE ATTACHED DRAWINGS

FIGS. 6(a)–(f) illustrate the process according to an embodiment of the invention for making the three-dimensional aperture structure in the photoresist layer.

FIGS. 7–10 are some examples of the three-dimensional aperture structure.

Figure 11A:
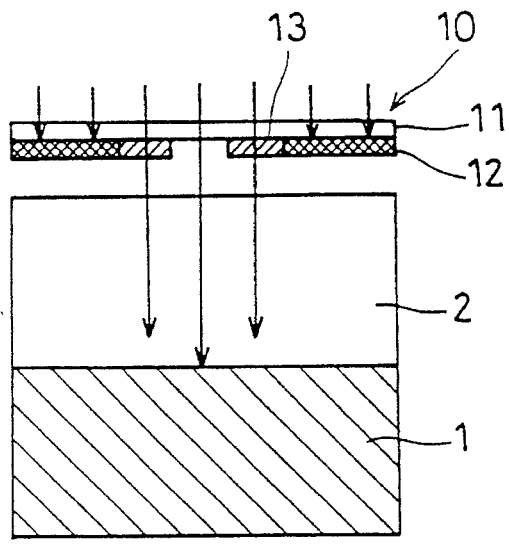
Figure 11C:
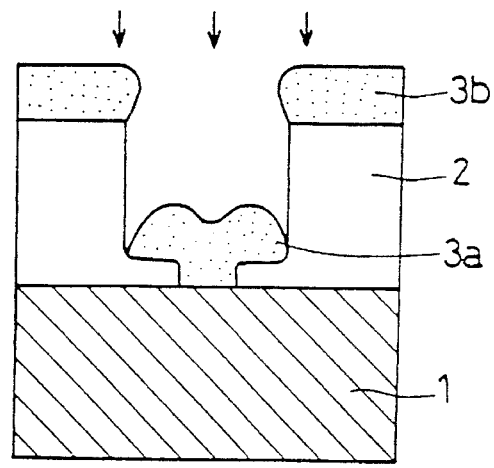
Figure 11B:
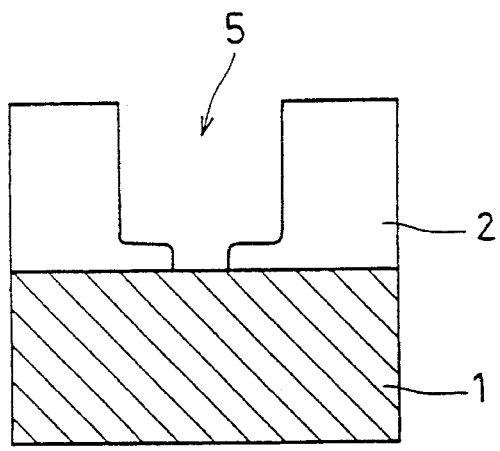

FIGS. 11(a)–(c) the process for making a mushroom type metal path using a three-dimensional aperture structure.

Figure 12:
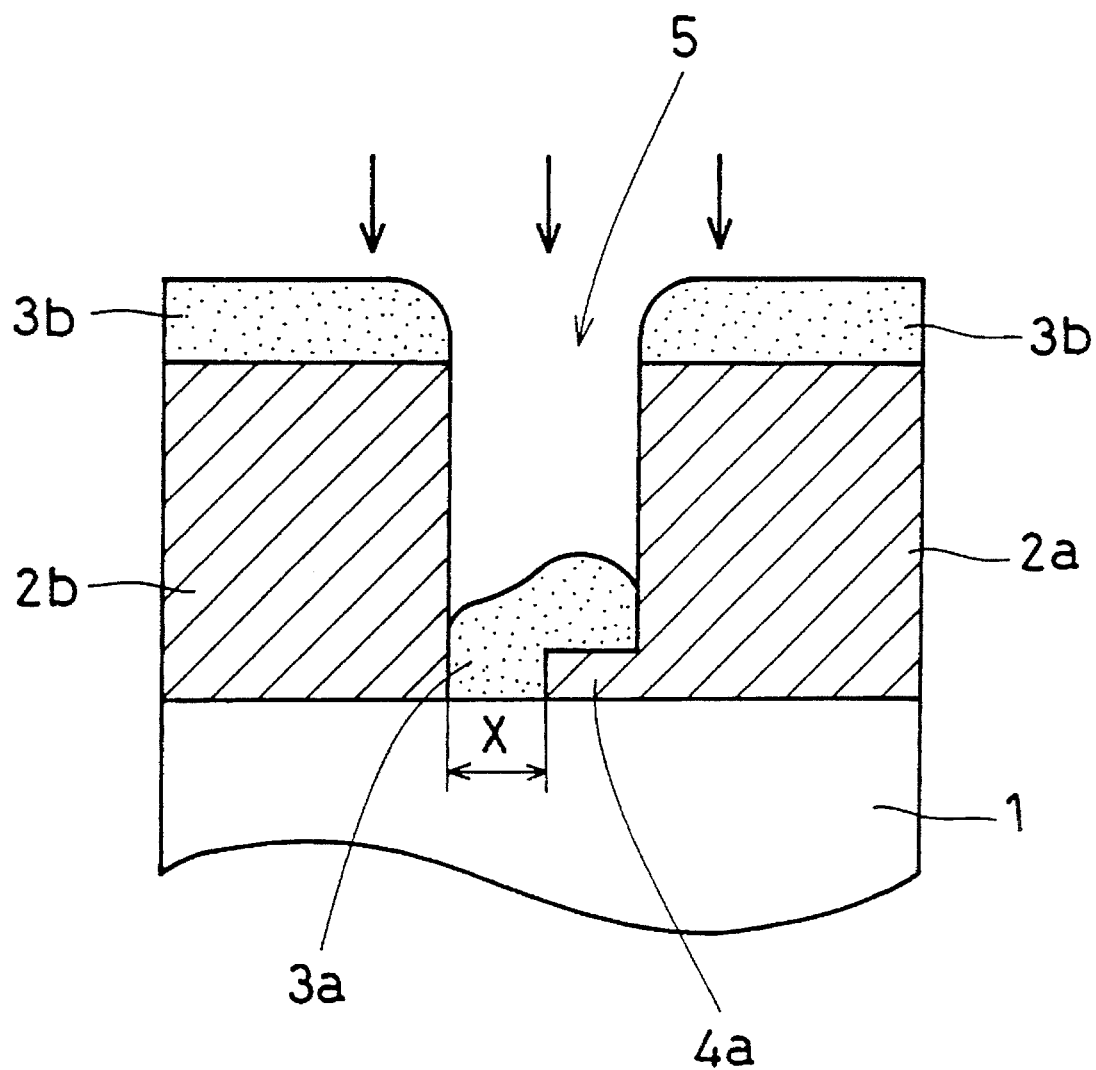

FIG. 12 is a cross sectional view of metal deposit, photoresist layer and substrate.

Figure 13:
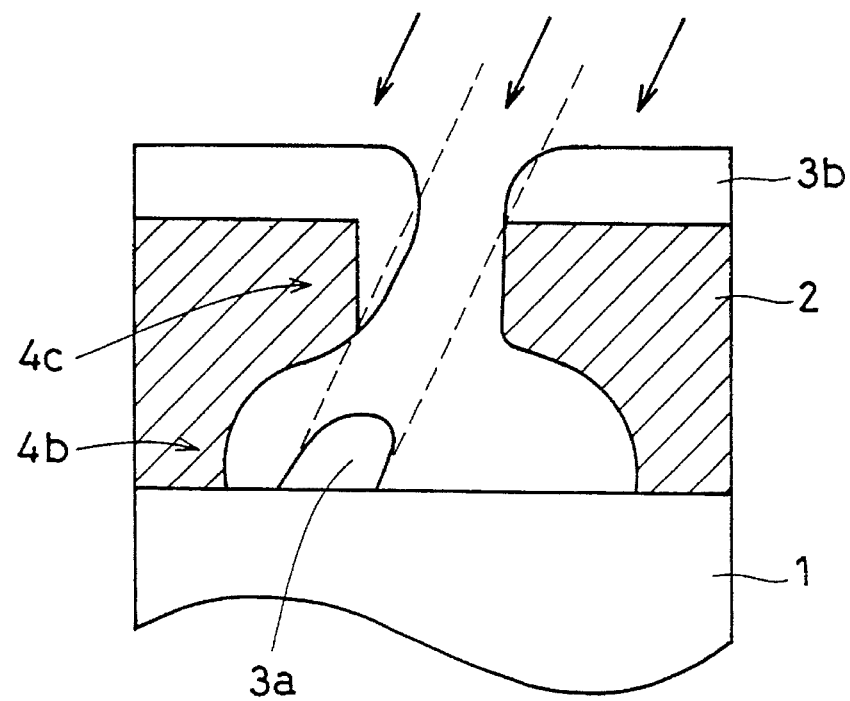

FIG. 13 illustrates an oblique metal vapor depositing over an overhang-overhang photoresist layer.

Figure 14:
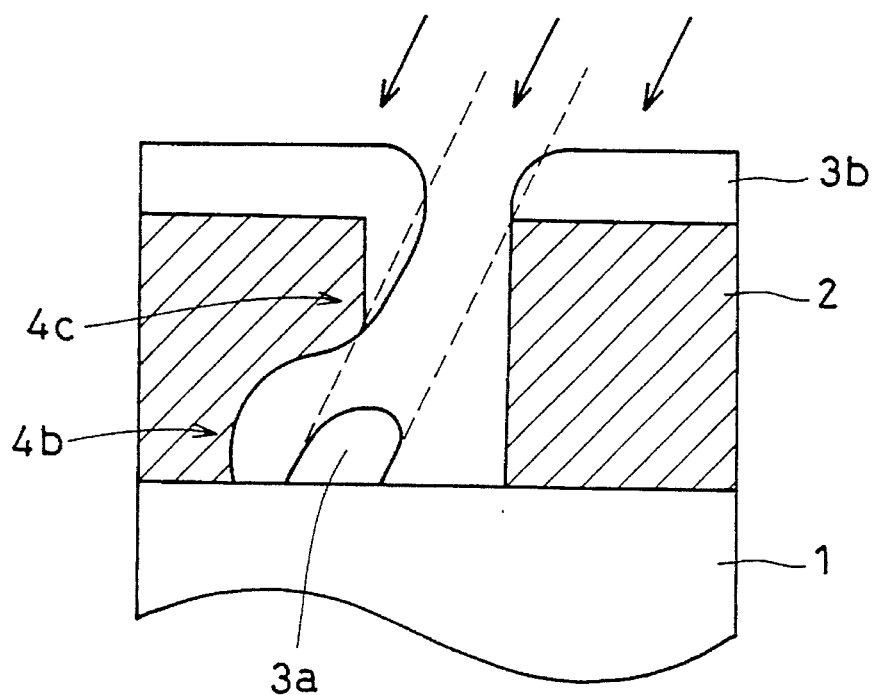

FIG. 14 illustrates an oblique metal vapor depositing over an overhang-flat wall photoresist layer.

Figure 15:
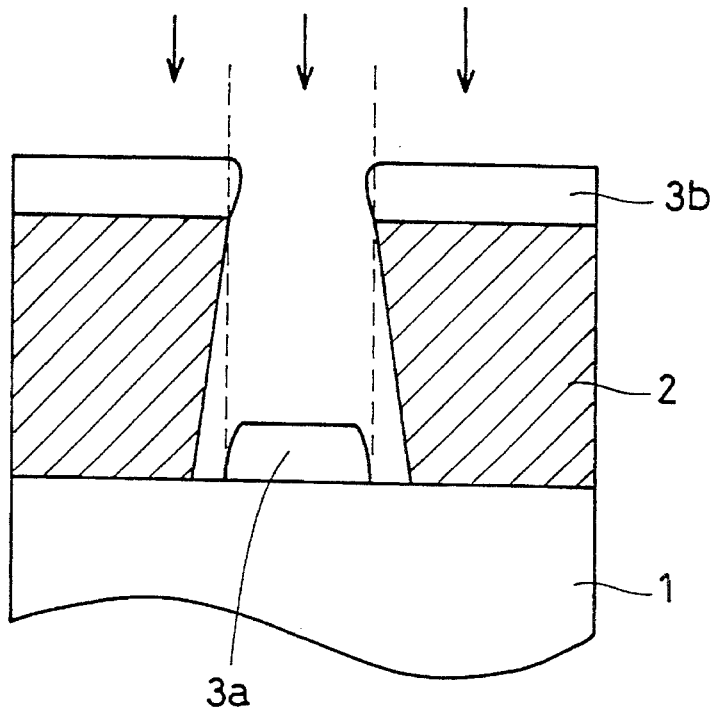

FIG. 15 illustrates a prior art method for forming a metal path on a substrate.

Figure 16:
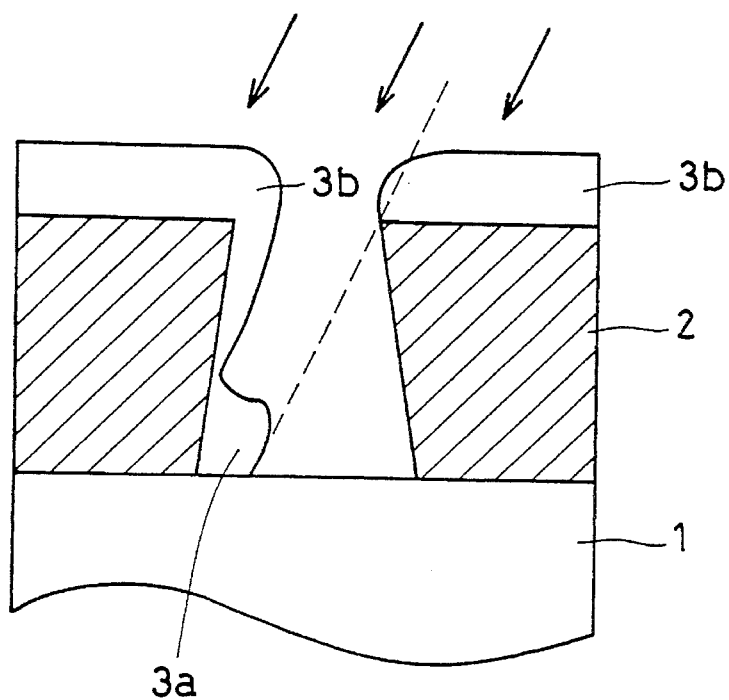

FIG. 16 shows a case of the prior art where the metal vapor is cast obliquely

Figure 17:
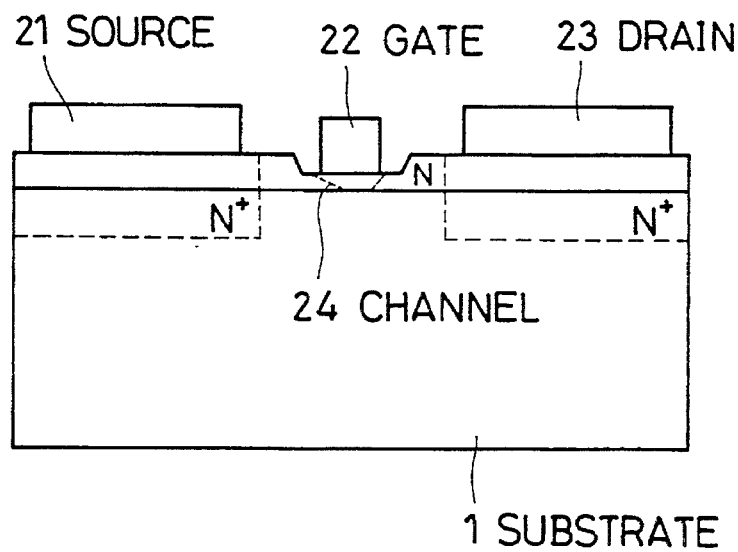

FIG. 17 is a cross sectional view of an MES-FET.

Figure 18:
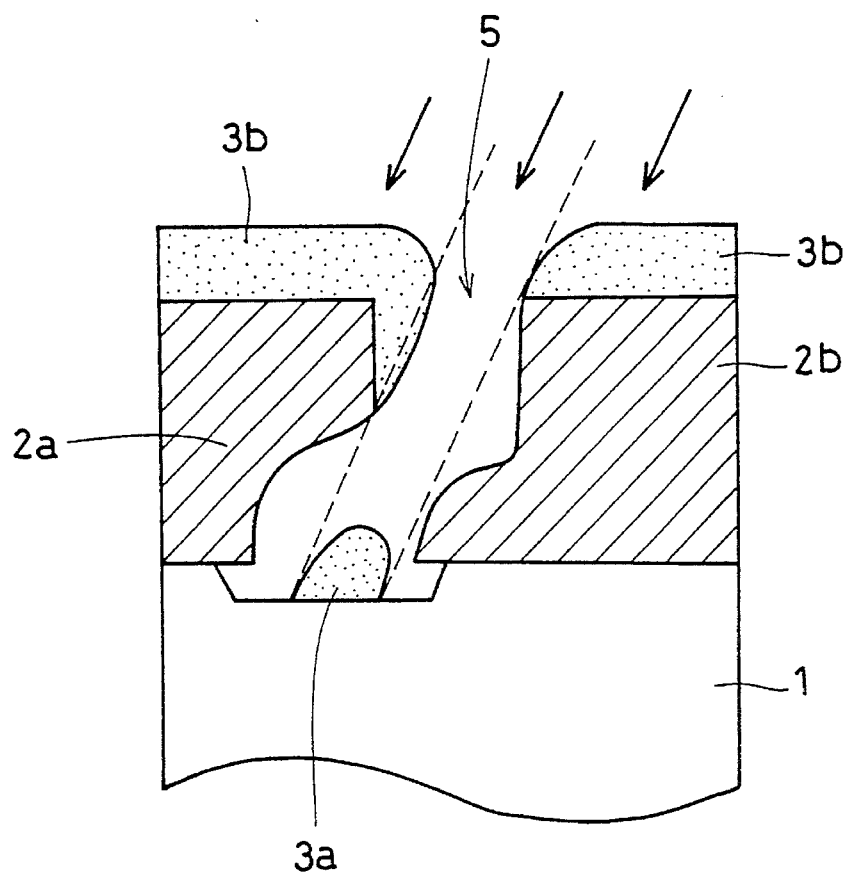

FIG. 18 illustrates the photolithographic process for forming the gate of the MES-FET.

Figure 19:
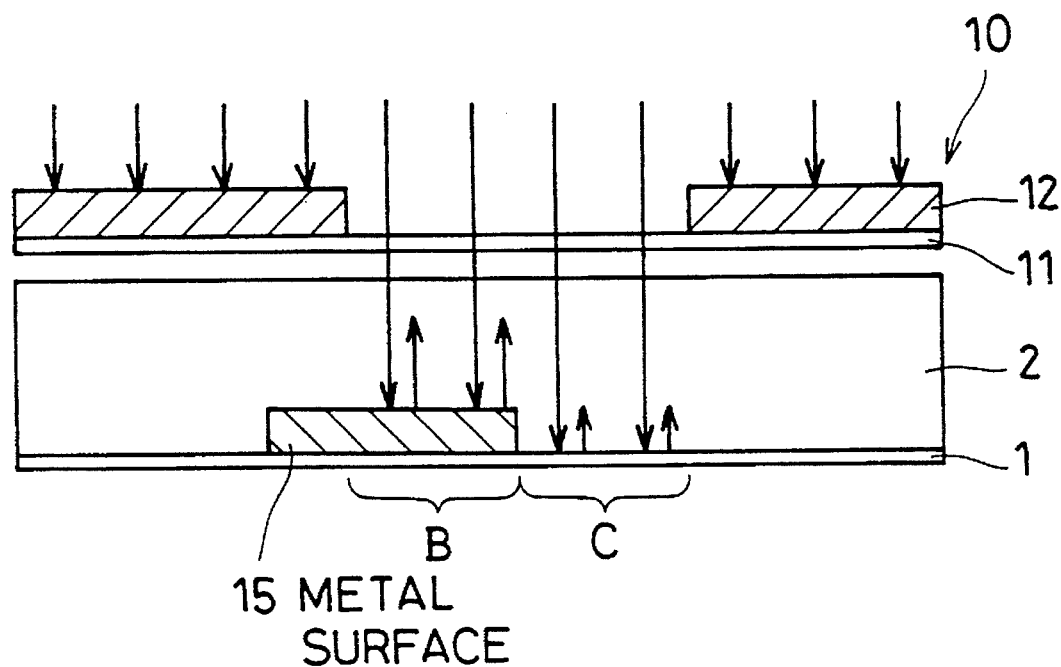

FIG. 19 illustrates an inhomogeneity in light absorption of the photoresist layer on different surface reflectivity.

Figure 20:
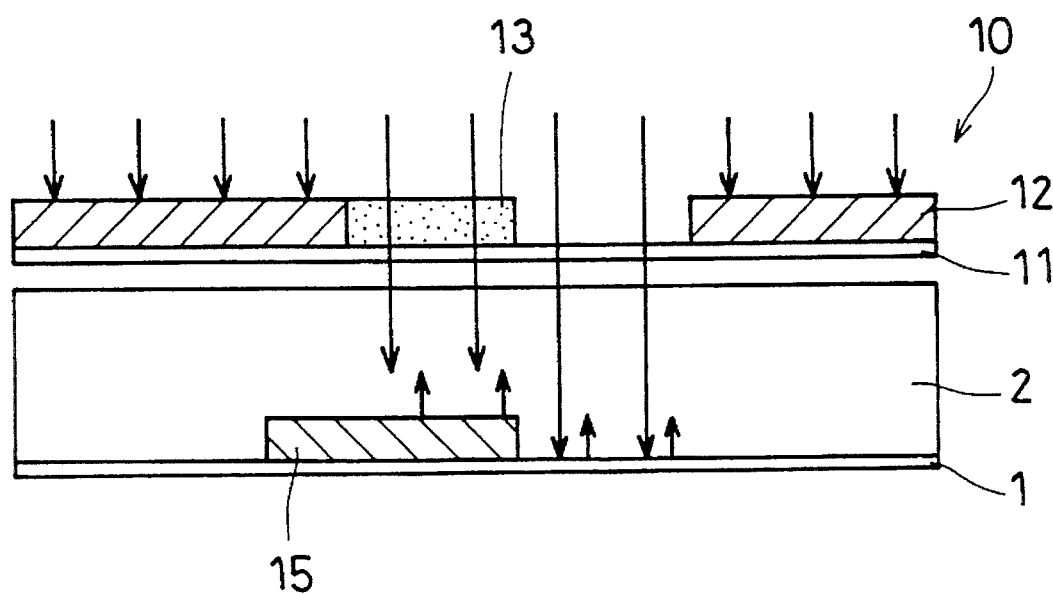

FIG. 20 illustrates a method compensating for the difference in the surface reflectivity.

Figure 21:
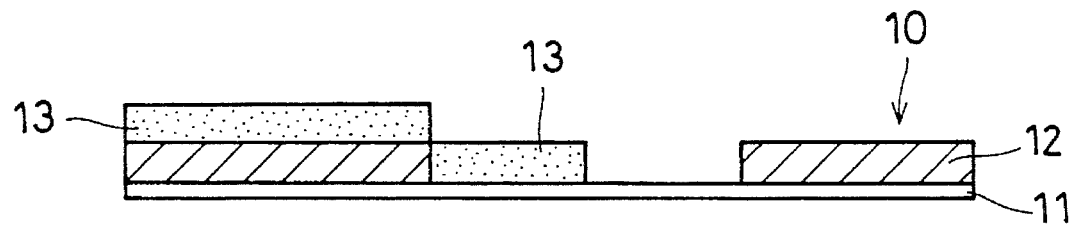

FIG. 21 is a variation of the photomask.

Figure 22:
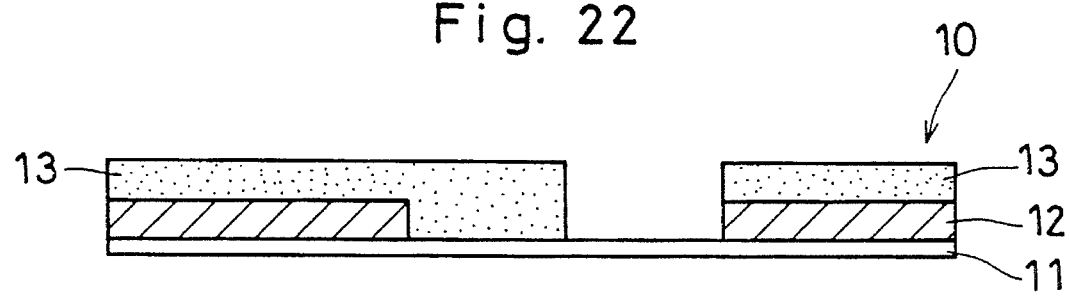

FIG. 22 is a second variation of the photomask.

Figure 23:
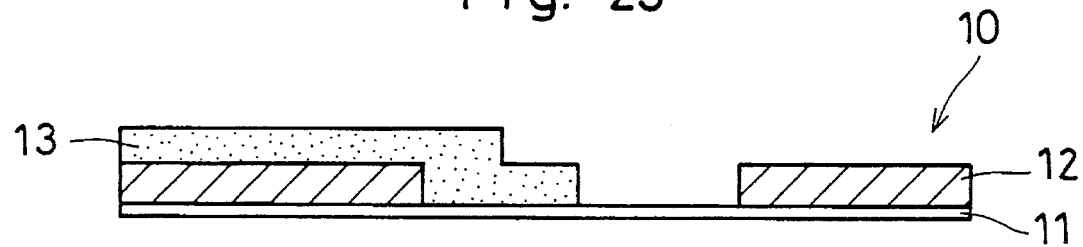

FIG. 23 is a third variation of the photomask.

Figure 24:
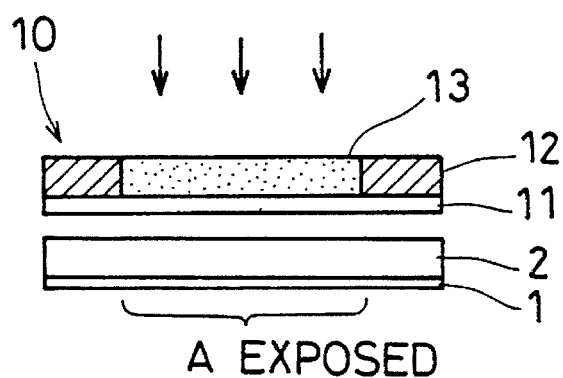

FIG. 24 is a cross sectional view of a photomask having an opaque part and a semi-transparent part.

Figure 25:
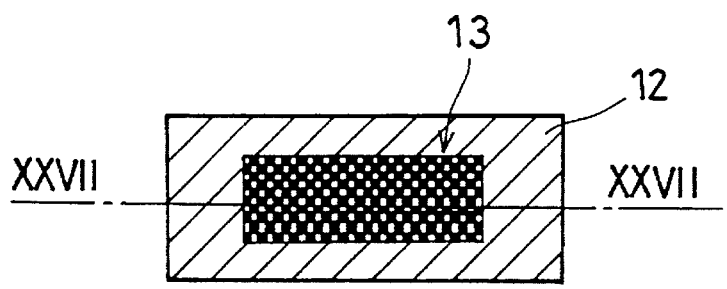

FIG. 25 is a plan view of an example of the fine check structure of semi-transparent photomask.

Figure 26:
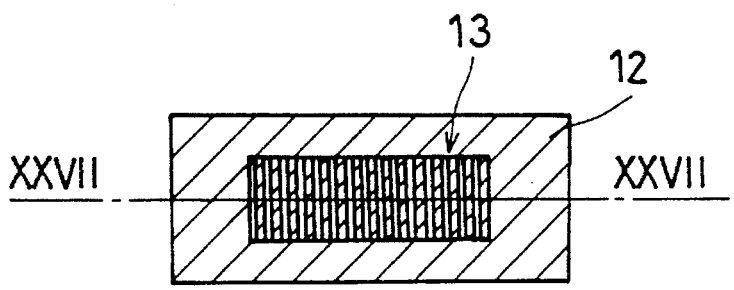

FIG. 26 is a plan view of an example of the fine stripe structure of semi-transparent photomask.

Figure 27:
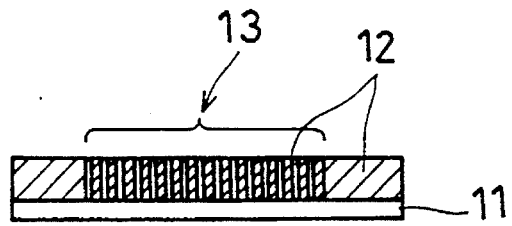
Figure 28A:
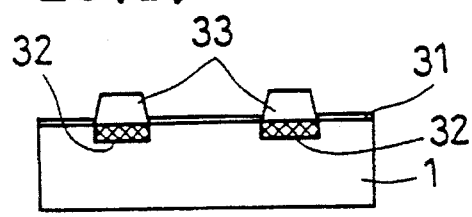
Figure 28B:
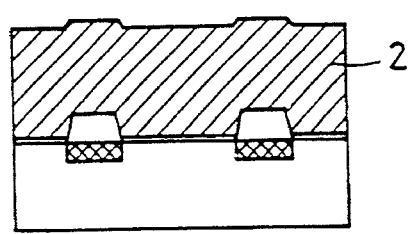
Figure 28C:
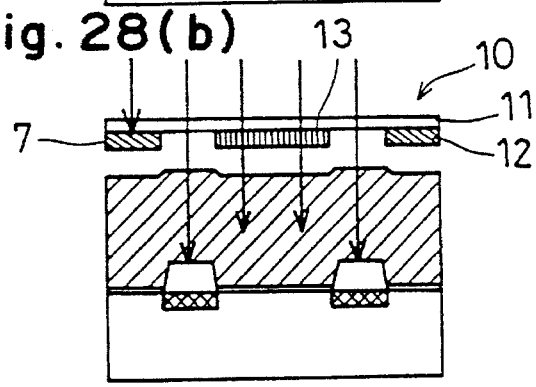
Figure 28D:
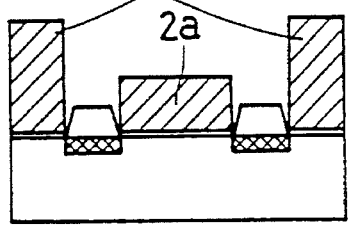
Figure 28E:
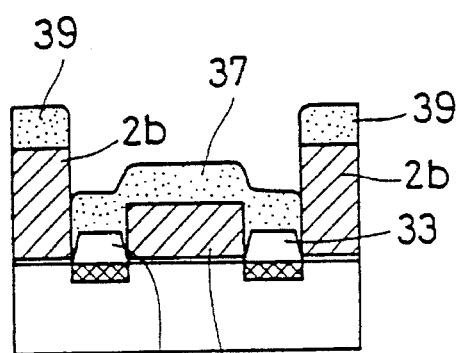
Figure 28F:
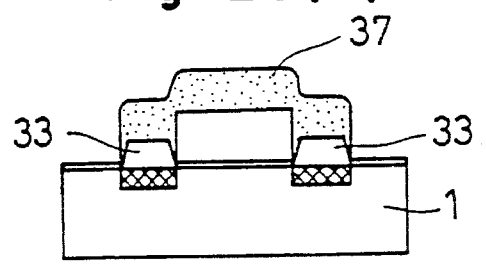

FIG. 27 is a cross sectional view of the fine check or fine stripe structure.

Figure 29:
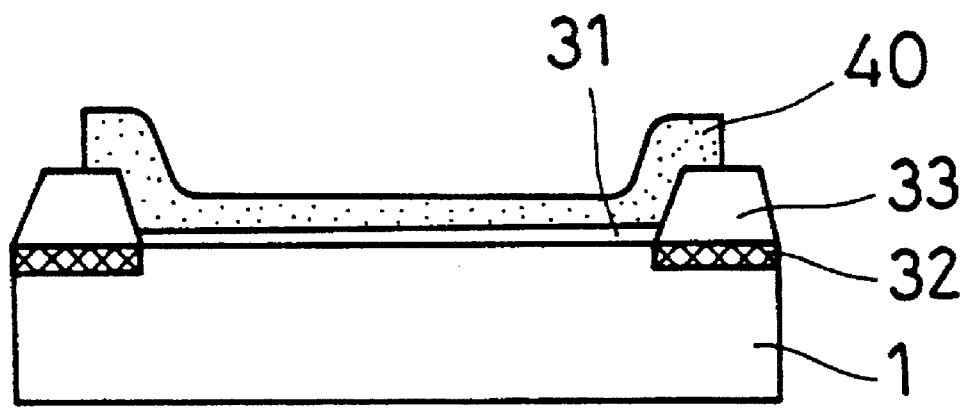
Figure 30A:
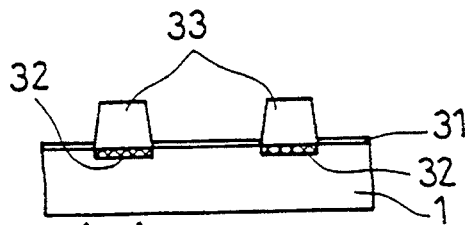
Figure 30B:
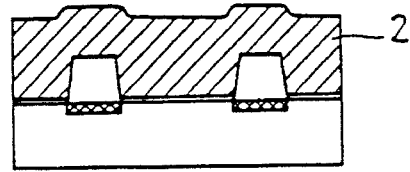
Figure 30F:
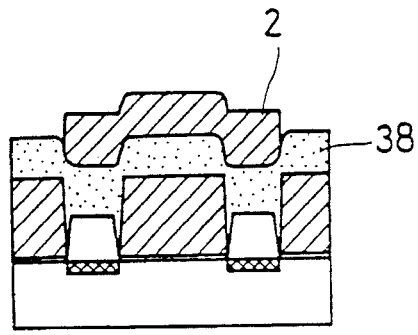
Figure 30C:
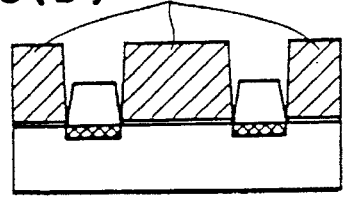
Figure 30G:
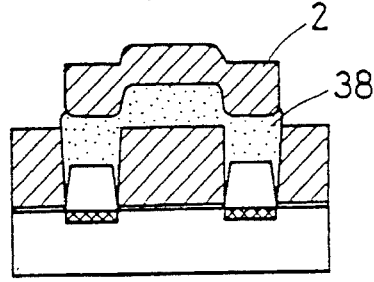
Figure 30D:
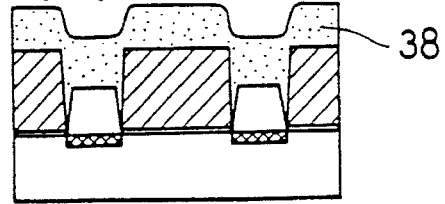
Figure 30H:
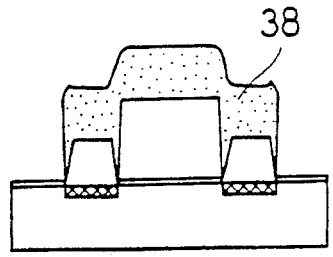
Figure 30E:
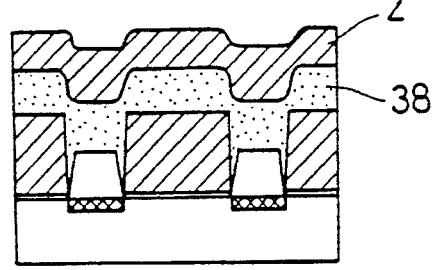

FIGS. 28(a)–(f) illustrate application of a gradation photomask;

FIG. 29 illustrates an exemplary prior art conduction path formed on a substrate; and FIGS. 30(a)–(h) illustrate an exemplary prior art process for forming an air bridge.

DETAILED DESCRIPTION OF THE PREFERRED EMBODIMENTS

Figure 1:
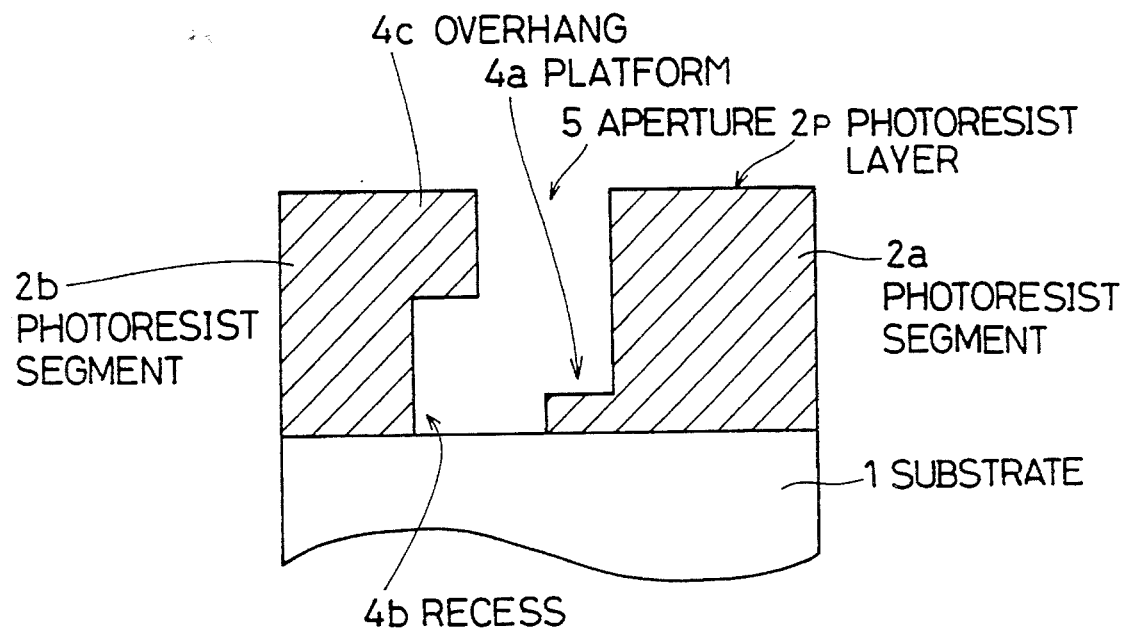
FIG. 1 is a cross sectional view of an overhang-platform aperture structure of the photoresist layer.

In FIG. 1, a photoresist layer $2p$ is laid with an aperture 5 to form a metal path pattern on a semiconductor substrate 1. The photoresist layer $2p$ is composed of several subdivided photoresist segments $2a$, $2b$, etc. forming the aperture 5 between them, and the cross-sectional structure of the aperture 5 is one of the feature point of the present invention: one side wall of the aperture 5 has a overhang structure and the other side wall has a platform structure. Looked downward from above, the width of the substrate 1 opened by the aperture 5 is partly shielded by a platform $4a$ of one photoresist segment $2a$. The other photoresist segment $2b$ has a recess $4b$ corresponding to the platform $4a$ with some clearance in the height.

Figure 2:
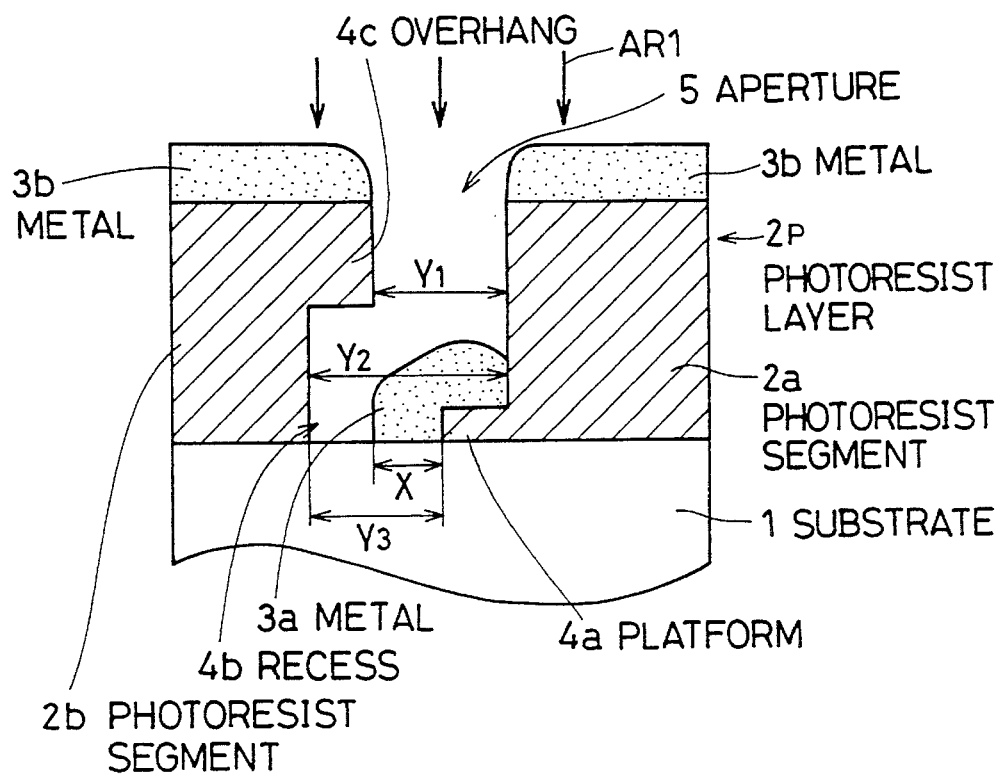
FIG. 2 is a cross sectional view after metal is deposited on the photoresist layer of FIG. 1.

When metal vapor (such as of Ti, Pt, Al, Au, etc.) is cast just downward (as the arrows AR1) over the photoresist-masked substrate, the metal is deposited as shown in FIG. 2. When the photoresist layer $2p$ is removed, the deposited metal layers $3b$ on the top of the photoresist segments $2a$, $2b$ are lifted off and the inverse-L shaped metal path $3a$ is left on the substrate 1 according to the aperture pattern.

Since the platform $4a$ of the photoresist segment $2a$ covers a part of the open area of the substrate 1 and the overhang $4c$ of the other photoresist segment $2b$ covers another part of the open area, the width X of the foot of the metal path $3a$ is narrower than the width $Y_3$ of the bottom of the open area. Conventionally, the width $Y_1$, $Y_2$ and $Y_3$ of every part of the gap between the photoresist segments $2a$ and $2b$ cannot be narrower than the resolution limit of the photolithography (which is mainly restricted by the minimum susceptible dimension of the photoresist to the light used in the photolithography). But, due to the overhang and platform structures of the photoresist segments $2a$ and $2b$, a metal path having a foot area (area contacting the substrate) narrower than the resolution limit can be formed. For example, with the dimensions of the gap widths $Y_1$, $Y_2$ and $Y_3$ as large as the resolution limit of the 0.4 μm, the metal path $3a$ can have narrower foot width of 0.2 μm.

Since the upper portion of the metal path $3a$ has the same width with that of the upper gap $Y_1$, the metal path $3a$ has a sufficient cross sectional area. That is, the electrical resistance of the metal path is assured low while the foot area is reduced. This narrow but low-resistant metal path is favored in forming gates. In the above embodiment, since the overhang $4c$ has some clearance over the platform $4a$ and a wide gap $Y_2$ is formed between the normal (i.e., resolution-limit wide) gaps $Y_1$ and $Y_3$, the metal deposit $3a$ does not contact the opposite photoresist segment $2b$, which facilitate the removal of the photoresist segment $2b$.

Figure 3:
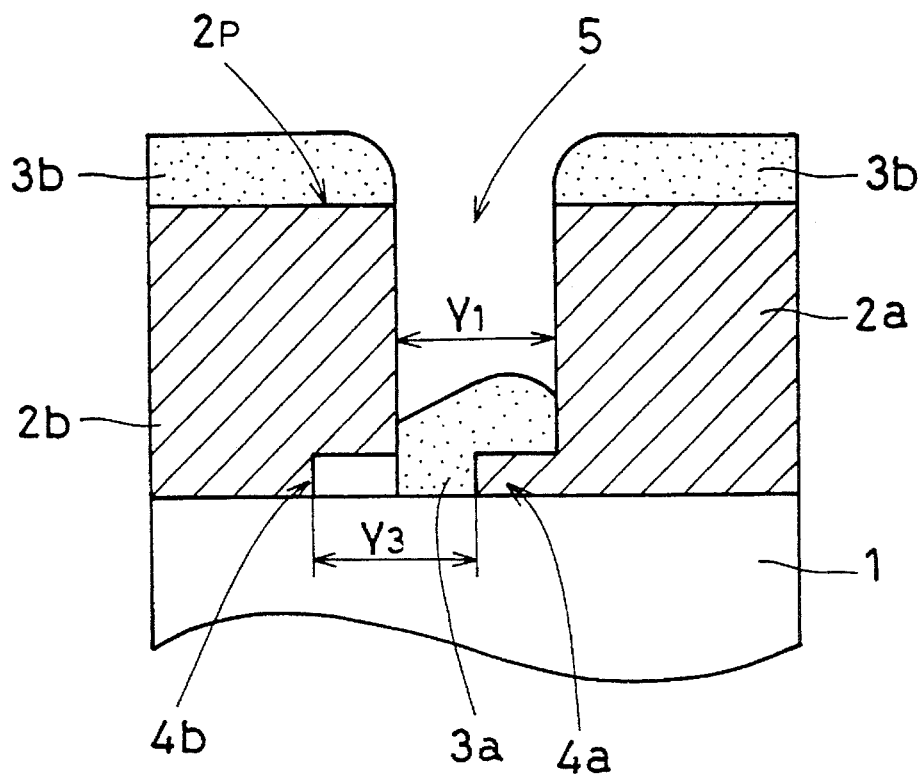
FIG. 3 is a cross sectional view of another overhang-platform structure after metal is deposited.
Figure 4:
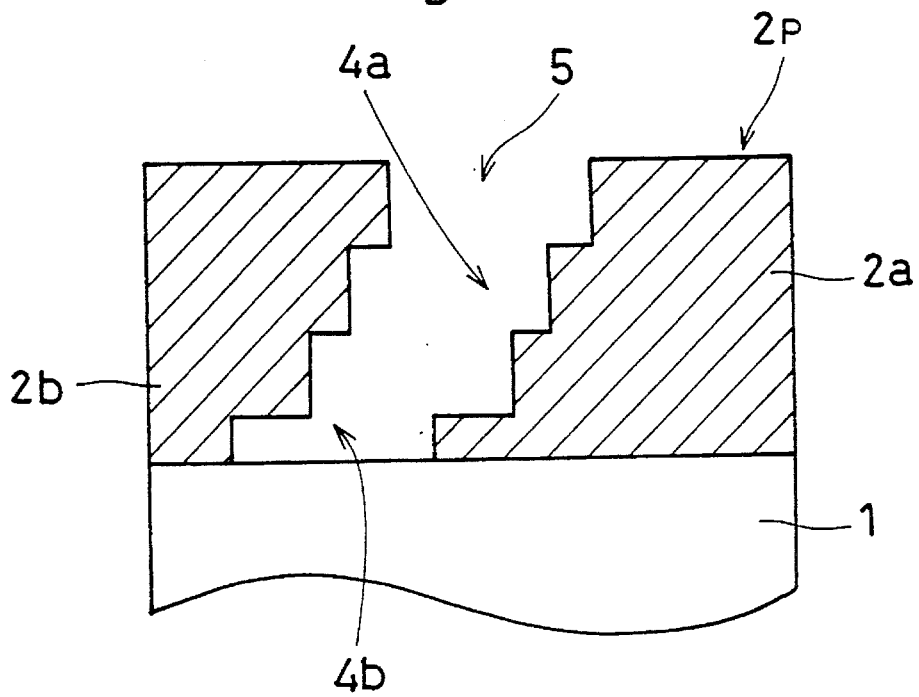
FIG. 4 is a cross sectional view of another three-dimensional aperture structure.

In another aperture structure shown in FIG. 3, the recess $4b$ and the platform $4a$ have the same height. When metal is deposited on this photoresist layer, the metal deposit $3a$ on the substrate 1 contacts both photoresist segments $2a$ and $2b$. In the structure of FIG. 4, the overhang and the platform are formed stepwise. When metal vapor is cast obliquely, narrow metal path is also formed on the substrate 1.

As will be described later, any form of overhang and platform structure of a photoresist layer can be made (i.e., the width and height of the overhang and platform, the clearance, gap width, number of steps, etc. can be designed) by adequately preparing a gradation pattern of a photomask. And the use of such aperture structures is not limited to the metal deposit: the narrow-pattern forming is of course applicable to etching or ion implantation techniques, in which substrate ditch or doped area narrower than the resolution limit can be formed.

Now the process of making such overhang-platform aperture structure is described. The invention process makes use of the image reversal process. Before explaining the invention process, the image reversal process is briefed first. Details of the image reversal process is described in "AZ 5200 Resists for Positive- and Negative Patterning" by Michael Bolsen, Hoechst Japan Limited, Electronic Materials Division.

Image Reversal Process

Figure 5:
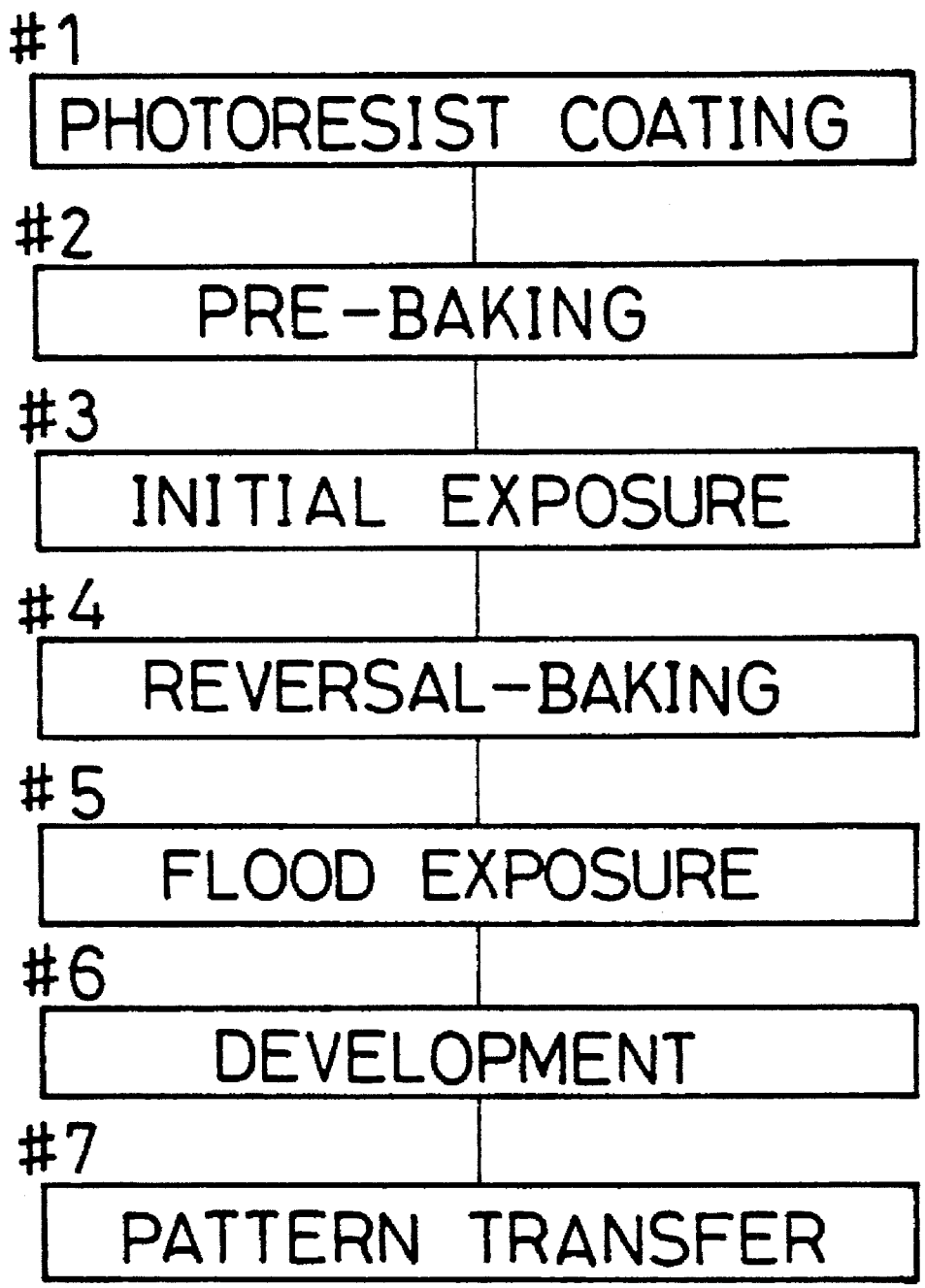
FIG. 5 is a flowchart of the image reversal process.

The image reversal process is performed as shown in the flowchart of FIG. 5. First, photoresist liquid is spin-coated on a substrate at step #1. The photoresist layer is pre-baked at step #2 and exposed to light through a photomask at step #3. The strength of light at this stage ("initial exposure") should be weak so that the exposed part may not fully stabilize, but should be strong enough to transfer the pattern on the photomask to the photoresist. Then the photoresist layer is baked again ("reversal baking") at step #4 to stabilize the portion of the photoresist layer that has been exposed to light in the initial exposure step. The overall photoresist layer is exposed to light ("flood exposure") at step #5 to enhance the solubility to alkaline solution of the portion of the photoresist layer that has not been exposed to light in the initial exposure step. When the development step #6 is processed, the photoresist pattern corresponding to the photomask pattern of the initial exposure step remains on the substrate. Finally, vapor deposition, etching, ion implantation or such surface patterning process is performed at step #7.

Making Overhang-Platform Aperture Structure

A process for making the overhang-platform aperture structure according to the present invention is illustrated in FIG. 6.

Figure 6A:
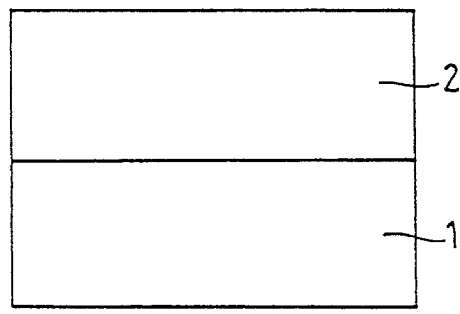

FIG. 6(a) shows a photoresist layer 2 spin-coated on a substrate 1 and pre-baked as steps #1 and #2 of the image reversal process.

Figure 6B:
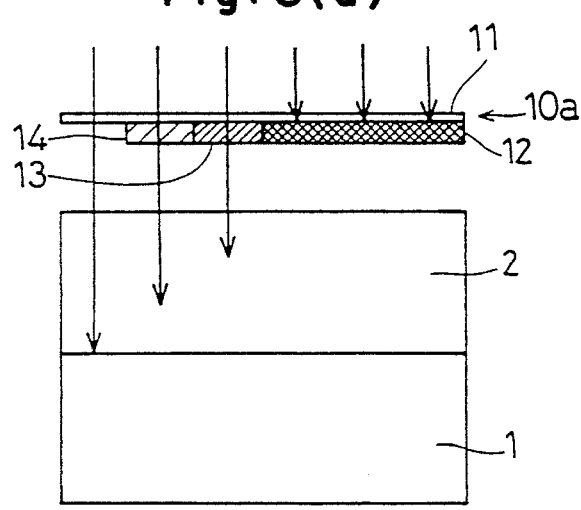

In FIG. 6(b), the photoresist-substrate is exposed to light through a photomask $10a$ ("initial exposure"; step #3). The photomask $10a$ is made of a fully transparent plate 11 (e.g., glass plate or quartz crystal plate) and a coating consisting of three parts having different transparencies (transmittances) to the exposure light used. The first part 12 is fully opaque to the light (e.g., chromium coating, emulsion coating, iron oxide coating, etc.), the second part 13 have some transparency to the light, and the third part 14 is more transparent than the second part 13 but not fully transparent. The second and third parts 13, 14 can be made by coating the transparent plate 11 with porous photoresist material, that added with colorant, emulsion mask and so on. When the light is cast through the photomask 10a on the photoresist layer 2, the part of the photoresist layer 2 corresponding to the first coating part 12 of the photomask 10a is not exposed to light. The parts of the photoresist layer 2 corresponding to the second and third coating parts 13, 14 receive a portion of the cast light corresponding to the transparency of the coating parts 13, 14. Therefore, in those photoresist layer parts, only its upper depth (the dimension corresponds to the photomask transparency) of the photoresist layer 2 is exposed to light. In the part of the photoresist layer 2 corresponding to no coating part of the photomask 10a, the light passes the full depth of the layer 2.

Figure 6C:
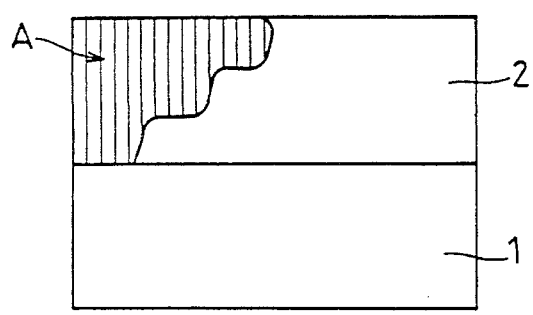
Figure 6D:
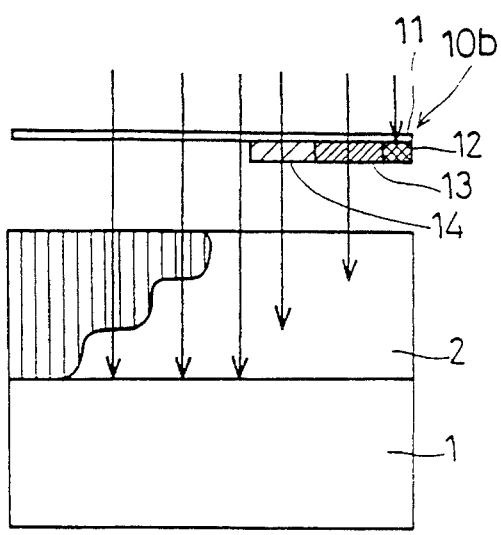

When the photoresist-substrate is reversal-baked (step #4) the part of the photoresist layer 2 (hatched part A of FIG. 6(c)) that has been exposed to light is stabilized.

In the flood exposure step (step #5) of this inventive method, the overall photoresist-substrate surface is not exposed to light as in the conventional image reversal process, but light is cast through another photomask 10b. The structure of the photomask 10b this step is similar to that used in the initial exposure step, but the coating pattern is different. Here the coating, also consisting of three different transparency parts, is placed within the part corresponding to the fully opaque part 12 of the photomask 10a used in the initial exposure step with some clearance between the borders.

Figure 6E:
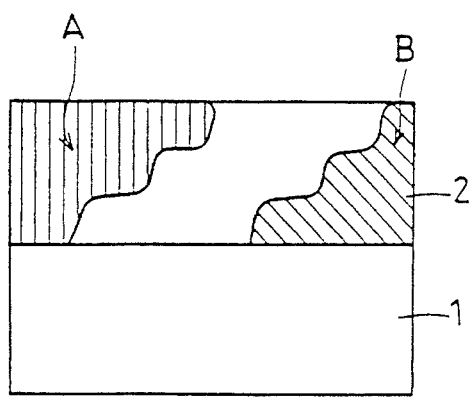

Since the part of the photoresist layer 2 that has been exposed to light in the flood exposure step becomes soluble to the alkaline solution, the part that has been exposed in the initial exposure step (hatched part A in FIG. 6(e)) and the part that has not been exposed in the flood exposure step (hatched part B) remain on the substrate 1 when the photoresist-substrate is washed by the alkaline solution (developer).

Figure 6F:
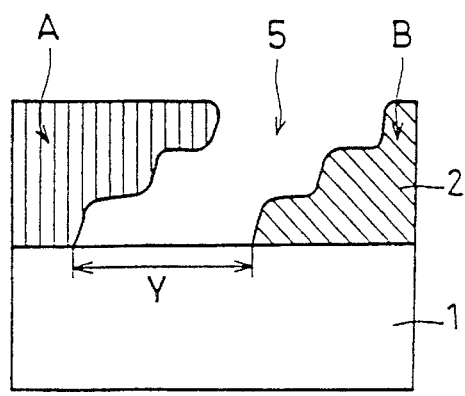
Figure 7:
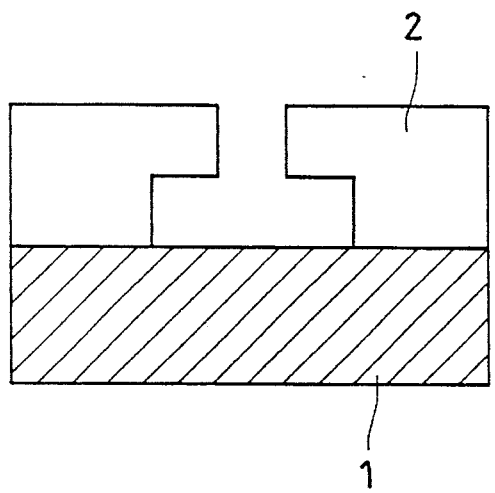
Figure 8:
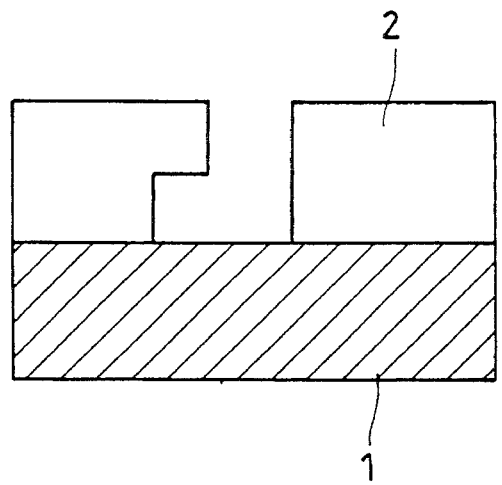
Figure 9:
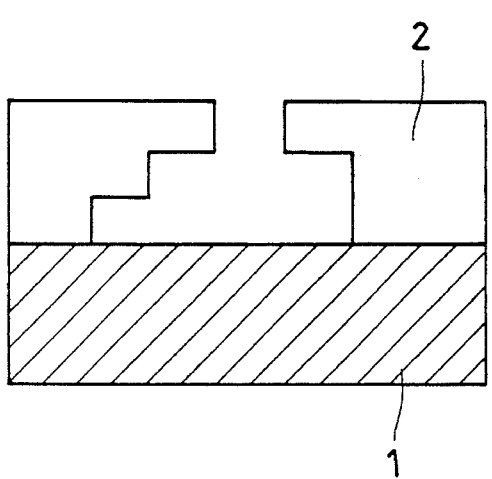
Figure 10:
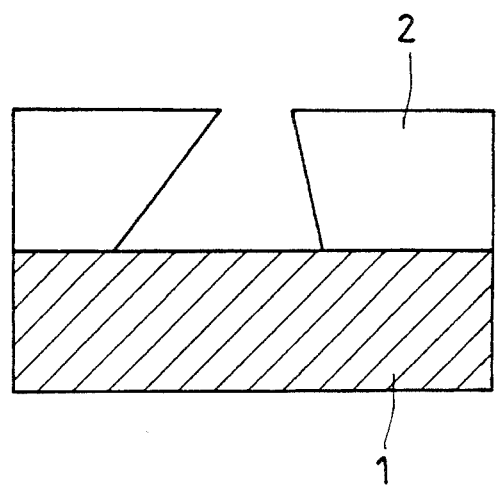

After the developing step (step #6), the part of the photoresist layer 2 corresponding to the margin between the borders of the photomasks 10a and 10b becomes an aperture 5, and the remaining photoresist segments A and have the overhang and platform structures corresponding to the gradation of the coatings, as shown in FIG. 6(f).

In the above process, normal negative type or normal positive type photoresist material cannot be used to make a photoresist layer having such an overhang-platform structure. When normal negative type photoresist material is used, the photoresist layer would have only the overhang structure, and when normal positive type photoresist material is used, the photoresist layer would have only the platform structure.

Some Examples of Aperture Structure

The overhang-platform structure is only a specific example of three-dimensional structure of the photoresist layer. The modified image reversal process using the gradation photomask as described before in FIGS. 5 and 6 can make various kinds of three-dimensional structure of the photoresist layer by adequately designing the photomask gradation pattern. Some of other examples are shown in FIGS. 7–10. By using these three-dimensional photoresist layers, various new techniques will be developed in photolithography. FIG. 11 shows a process for forming a mushroom-type metal path deposit 3a using a platform-platform aperture structure, and FIG. 12 shows a platform-flat wall structure for forming the same.

An application of the overhang-overhang (or overhang-flat wall) structure is here described referring to FIGS. 13 and 14. Before explaining the application, prior art method for forming a metal path on a substrate is described. As shown in FIG. 15, prior art method could only make slightly slant side walls of the photoresist aperture. Thus, when metal vapor is obliquely cast through the aperture in order to make a narrow metal path, as in FIG. 16, the metal deposit 3a on the substrate 1 connects to the metal 3b deposited on the side wall and on the top of the photoresist layer. The overhang structure avoids such connection, as shown in FIGS. 13 and 14: when metal vapor is cast obliquely, the metal deposit 3a on the substrate 1 is independent and narrow.

The oblique metal vapor casting for making a narrow metal deposit can be applied to form the gate of a MES-FET (Metal-semiconductor Field-effect Transistor) (FIG. 17) using an overhang-platform aperture structure as shown in FIG. 18. Before the metal deposition, the semiconductor substrate 1 is etched to form a recess for the channel 24, and then the metal deposit 3a is placed on the recess surface as shown in FIG. 18. This technique is of course applicable to MOS-FET (Metal-oxide-semiconductor FET).

Application of the Gradation Photomask

In the prescribed image reversal process (FIG. 6), the photomasks 10a and 10b had a gradation in the exposure light transparency. Such a gradation photomask has another application.

When there are two different surfaces on the substrate having different reflectivity, as shown by B and C in FIG. 19, the light absorbing amount of the photoresist 2 differs on those parts: the part of the photoresist layer 2 on the high-reflectivity surface B absorbs more light amount than the other part on the low-reflectivity surface C. This difference in the light absorbing amount is unintentional to the mask design (pattern of the opaque coating 12 on the glass plate 11) of the photomask 10 and has a deleterious effect in the photolithography. Preparing several photomasks corresponding to the surface reflectivities is awkward.

As shown in FIG. 20, a photomask 10 having a gradation 11, 12, 13 corresponding to reflectivities of the substrate surfaces solves the problem. In this case, the transparency (transmissivity) of every part of the gradation 11, 12, 13 is designed to correspond to the surface reflectivity. FIGS. 21–23 show other examples of the gradation photomask used for the reflectivity-compensated photolithography. Among them, the photomask 10 of FIG. 23 is given the transparency gradation by the thickness of the coating layer 13, rather than by the material as used in the previous description (FIG. 6).

The transparency gradation for the photomask can be given by different method as shown in FIGS. 24–27, in which the semi-transparent part 13 of the photomask 10 is made of fine mesh pattern. FIG. 25 illustrates a check pattern as an example, and FIG. 26 illustrates a stripe pattern as another example. Small dot pattern is an alternative which is not shown by a drawing. By changing the density of the dots etc., any pattern of gradation can be designed. The dimension of the mesh should be smaller than the resolution limit of the photoresist.

The gradation photomask is also useful in a low-dose exposure. In normal photolithography, every unit area of a substrate containing many such areas is exposed to light step by step using a light shutter. When a very low dose exposure is required, the shutter speed should be very high. Instead of using an expensive high-speed shutter, the gradation photomask can give very low exposure dose to the photoresist.

A felicitous application of the gradation photomask is illustrated in FIG. 28, in which an air bridge conduction path 37 is formed on a substrate 1. An air bridge conduction path is preferred especially in high speed (high frequency) chips, because, in conventional chips, a base conduction path (path 40 that runs on the surface of the substrate via an insulation 31 as in FIG. 29) yields a stray capacitance between the conduction path 40 and the substrate 1. An air bridge path is also useful in high density chips where crossing of conduction paths are unavoidable.

Prior art of forming an air bridge is illustrated in FIG. 30. The prior art process requires many steps (as easily understood by the drawings (a)–(h)), and, in the step (f), excessive parts of the metal layer 38 must be removed by ion milling technique. Compared to the costly and time consuming prior art method, the method shown in FIG. 28 using a gradation photomask 10 is simple and needs no additional apparatus such as the ion milling machine.

The photomask 10 used in step (c) of this process has full transparent regions (uncoated part of the transparent plate 11) corresponding to electrodes 33,33 and a semi-transparent part 13 corresponding to the path between the electrodes 33, 33. Thus, after light exposure through the photomask 10, the part of positive photoresist layer 2 that absorbed light is selectively washed out and unexposed parts 2a and 2b remain on the substrate 1 (step (d)). When metal vapor is deposited on the photoresist-substrate, the air bridge path 37 connecting the electrodes 33, 33 is separated per se from the other metal deposit 39, which makes the ion milling step unnecessary. Then, by removing the remaining photoresist segments 2a, 2b, the air bridge conduction path 37 is left and the other metal deposits 39 are easily removed.

What is claimed is:

1. A photolithographic method for manufacturing a semiconductor device comprising:

a step of applying photoresist onto a semiconductor substrate;

a step of pre-baking said photoresist;

a step of initially exposing said photoresist to light through a photomask, said photomask comprises a first part, a second part and a third part, each having different transparencies for exposing said photoresist, said first part being relatively opaque to said light, said second part being more transparent to said light than said first part, and said third part being more transparent to said light than said second part;

a step of reversal-baking said photoresist;

a step of flood-exposing said photoresist to light through another photomask positioned over an initially non-exposed region of the photoresist, said another photomask comprises a first part, a second part and a third part, each having different transparencies for exposing said photoresist, said first part being relatively opaque to said light, said second part being more transparent to said light than said first part, and said third part being more transparent to said light than said second part; and a step of developing said photoresist to form an aperture therein, said aperture having a platform and an overhang formed in a wall of said aperture.

2. A photolithographic method according to claim 1, further comprising a step of depositing metals onto said substrate through said aperture having the platform and the overhang.

3. A photolithographic method according to claim 2, further comprising a step of removing said photoresist having the platform and the overhang from said substrate.

4. A photolithographic method according to claim 1, wherein said method is applied for etching of said substrate through said aperture having the platform and the overhang.

5. A photolithographic method according to claim 1, wherein said method is applied for implantation of ions into said substrate through said aperture having the platform and the overhang.

* * * * *